(12) United States Patent
Mihashi et al.

(10) Patent No.: US 7,187,701 B2
(45) Date of Patent: Mar. 6, 2007

(54) RIDGE WAVEGUIDE SEMICONDUCTOR LASER

(75) Inventors: Yutaka Mihashi, Tokyo (JP); Tohru Takiguchi, Tokyo (JP); Toshio Tanaka, Tokyo (JP); Tomoko Kadowaki, Tokyo (JP); Yoshihiko Hanamaki, Tokyo (JP); Nobuyuki Tomita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 309 days.

(21) Appl. No.: 10/799,714

(22) Filed: Mar. 15, 2004

(65) Prior Publication Data

US 2004/0218646 A1 Nov. 4, 2004

(30) Foreign Application Priority Data

Apr. 30, 2003 (JP) .............................. 2003-125275

(51) Int. Cl.
*H01S 5/00* (2006.01)
(52) U.S. Cl. ............................... 372/46.01; 372/45.01; 257/79
(58) Field of Classification Search ............. 372/46.01, 372/45.01, 75, 96
See application file for complete search history.

(56) References Cited

U.S. PATENT DOCUMENTS 5,381,434 A 1/1995 Bhat et al.

6,323,507 B1 * 11/2001 Yokoyama et al. ........... 257/79
6,526,087 B1 2/2003 Okuda
6,583,510 B2 6/2003 Hanamaki et al.
2003/0165169 A1 * 9/2003 Nomoto et al. ................ 372/46

FOREIGN PATENT DOCUMENTS

JP 7240564 9/1995

OTHER PUBLICATIONS

"Effect of Au thickness on laser beam penetration in Invar-to-Invar packages" Wang, S.C.; Chang, H.L.; Wang, C.; Wang, C.M.; Liaw, J.W.; Sheen, M.T.; Sheu, Y.C.; Kuang, J.H.; Chi, S.; Yang, Y.D.; Cheng, W.H.; Electronic Components and Technology Conference, 1997. Proceedings., 47th; May 18-21, 1997 pp. 1272-1276.*
"Effect of Au thickness on laser beam penetration in Invar-to-Invar Packages" Wang, S.C.; Chang, H.L.; Wang, C.; Wang, C.M.; Liaw, J.W.; Sheen, M.T.; Sheu, Y.C.; Kuang, J.H.; Chi, S.; Yang, Y.D.; Cheng, W.H.; Electronic Components and Technology Conference, 1997. Proceedings., 47th; May 18-21, 1997 pp. 1272-1276.*

* cited by examiner

*Primary Examiner*—Minsun Oh Harvey
*Assistant Examiner*—Tuan N. Nguyen
(74) *Attorney, Agent, or Firm*—Leydig, Voit & Mayer, Ltd.

(57) ABSTRACT

A ridge waveguide semiconductor laser includes an active layer, semiconductor layers on the active layer and having a ridge-shaped waveguide, an insulating film on the semiconductor layer, a first electrode layer in contact with the semiconductor layer through an opening in the insulating film, and a second electrode layer on the first electrode layer having a stripe shape and extending along the waveguide. A distance from an end face of a resonator of the laser to an edge of the second electrode layer does not exceed 20 μm.

7 Claims, 9 Drawing Sheets

Thickness of Au Vapor Deposition Electrode (nm)

RIDGE WAVEGUIDE SEMICONDUCTOR LASER

BACKGROUND OF THE INVENTION

1. Field of the Invention

The present invention relates to a ridge waveguide semiconductor laser, and, more particularly, to a ridge waveguide semiconductor laser mainly used for optical communications.

2. Background Art

In recent years, optical fiber communications have rapidly spread, so that semiconductor lasers for communications have found wide applications in this field from trunk systems to subscriber systems. Furthermore, with the rapid spread of the Internet and the advancement of network computing, there has been an increasing need to provide a high-speed low-cost LAN (Local Area Network) by use of optical fiber. As such, there has been also an increasing need to enhance the speed and the temperature characteristics of semiconductor lasers for data communications, which are a key device of such LANs. Several semiconductor lasers have been proposed to satisfy the above need, as described in Japanese Laid-Open Patent Publications Nos. Hei07-240564 and 2000-261093 and the specifications of U.S. Pat. No. 5,381,434 and U.S. Pat. application (laid-open) No. 2002/0113279.

Reducing the cost of an optical communications apparatus or optical communications system for data communications requires a highly reliable semiconductor laser having a long life capable of operating at high speed and high temperature without the need for a cooling system.

FIG. 8 is a perspective view of a conventional ridge waveguide type semiconductor laser, and FIG. 9 is a plan view of the ridge waveguide type semiconductor laser shown in FIG. 8.

Referring to these figures, an n side electrode 51 is provided on the rear surface of an n-InP substrate 50. On the other hand, an epitaxial layer is formed on the top surface of the n-InP substrate 50. The epitaxial layer is made up of: an n-InP cladding layer 52; an MQW (Multiple Quantum Well) active layer 53 including AlGaInAs strained quantum wells; a p-InP cladding layer 54; and p-InGaAs contact layer 55. Two grooves 56 and 57 are provided in the epitaxial layer such that they run in parallel with each other like stripes. A ridge-shaped waveguide 58 is formed on the area sandwiched by the grooves 56 and 57. Furthermore, an $SiO_2$ (silicon dioxide) film 60 having a thickness of approximately 400 nm is formed on the entire top surface except for an opening 59 provided above the waveguide 58; that is, it is formed on the p-InGaAs contact layer 55 and the grooves 56 and 57.

A p side electrode 61 is provided over the opening 59 such that it is in contact with the p-InGaAs contact layer 55 thereunder through the opening 59. It should be noted that the p side electrode 61 is made up of a Ti (titanium) vapor deposition electrode(not shown) having a thickness of approximately 50 nm and an Au (gold) vapor deposition electrode (not shown) having a thickness of approximately 200 nm.

An Au-plated electrode 62 having a thickness of approximately 3 μm is formed on the p side electrode 61. Furthermore, an electrode lead-out line 63 is formed such that it extends from the Au-plated electrode 62. The end of the electrode lead-out line 63 constitutes a bonding pad portion 64. Such a structure enhances the heat dissipation characteristics of the electrode portion as well as facilitating pressure-bonding of leads of Au, etc. to the bonding pad portion 64.

If a positive (+) bias and a negative (−) bias are applied to the p side electrode 61 and the n side electrode 51, respectively, a current flows through the waveguide 58 predominantly. As a result, electrons and holes are injected into an active region 67 right under the waveguide 58, leading to light emission due to electron-hole recombination. Then, if the current is increased to more than a threshold value, induced emission begins, which will lead to laser oscillation, emitting laser light L'.

Generally, the end faces of a semiconductor laser resonator are obtained through crystal cleavage. That is, the element constituting each semiconductor laser is cut from a semiconductor substrate by way of crystal cleavage. In order to obtain good cleavage characteristics, conventional semiconductor lasers have a structure in which the Au-plated electrode 62 is not disposed near the cleaved surfaces, and furthermore the distance R' from the resonator end faces 65 and 66 to the respective near edges of the Au-plated electrode 62 is set to as long as approximately 50 μm, as will be described in detail below.

The angle of each cleaved surface with respect to the wafer-reference plane usually varies from its target value; that is, they may be displaced with respect to the electrode pattern. Therefore, if the cleaved surfaces are displaced toward the Au-plated electrode 62 so that the distance R' from the Au-plated electrode 62 to the resonator end faces 65 and 66 becomes too short, the cleaved surfaces may cross the Au-plated electrode 62, making it difficult to obtain good cleaved surfaces since the stress produced at the time of cleavage is absorbed by the Au-plated electrode 62.

For example, if the distance R' from the resonator end faces 65 and 66 to the respective near edges of the Au-plated electrode 62 is set to 10 μm or less, the cleaved surfaces may tend to cross the Au-plated electrode.62 due to their displacement with respect to the electrode pattern. The Au-plated electrode 62 generally has a thickness of approximately between 2 μm and 4 μm. Therefore, when a cleaved surface has crossed the Au-plated electrode 62, the stress is absorbed by the Au-plated electrode 62, making it impossible to obtain a good cleaved surface.

On the other hand, to achieve a high modulation rate at high temperature, such semiconductor lasers are configured such that the length of the resonator is short and the reflectance levels of the resonator end faces are high, as compared with conventional semiconductor lasers. For example, to achieve a high modulation rate of approximately 10 Gbps at 85° C., which is required for semiconductor lasers for data communications in recent years, the resonator length has been reduced from approximately 300 μm (conventional value) to approximately 200 μm. As for the reflectance levels of the resonator end faces, the reflectance level of the front end face has been increased from approximately 30% (conventional value) to approximately between 60% and 65%, while that of the rear end face has been increased from approximately 60% (conventional value) to approximately 95%.

Increasing the reflectance levels of the resonator end faces, however, makes it difficult for the emitted light to leave the resonator, increasing the value of the current (operational current) necessary to obtain a predetermined optical output. Especially, since conventional ridge waveguide type semiconductor lasers employ the Au-plated electrode 62 having a thin film thickness (not more than 200 nm), the current density in the electrode is high, imposing a large heat load on the element due to heat generation.

Further, if the edges of the Au-plated electrode 62 are set far away from the resonator end faces 65 and 66, as described above, the distance which current must flow in the thin p side electrode 61 to reach the neighborhoods of the resonator end faces 65 and 66 increases, thereby increasing the current density of the portions of the vapor deposition electrode near the edges of the Au-plated electrode 62. As a result, the temperature increases locally at these portions, reducing the reliability and the life of the device.

SUMMARY OF THE INVENTION

The present invention has been devised in view of the above problems. It is, therefore, an object of the present invention to provide a highly reliable ridge waveguide type semiconductor device capable of operating at high speed and high temperature.

Other objects and advantages of the present invention will become apparent from the following description.

According to one aspect of the present invention, a ridge waveguide type semiconductor laser comprises an active layer, a semiconductor layer formed on the active layer and having a ridge-shaped waveguide therein, an insulation film formed on the semiconductor layer, a first electrode layer in contact with the semiconductor layer through an opening provided in the insulation film, and a second electrode layer formed on the first electrode layer such that it is shaped like stripes and runs in a direction of the waveguide. A distance from an end face of a resonator to an edge of the second electrode layer is within 20 μm.

According to another aspect of the present invention, a ridge waveguide type semiconductor laser comprises an active layer, a semiconductor layer formed on the active layer and having a ridge-shaped waveguide therein, an insulation film formed on the semiconductor layer, a first electrode layer in contact with the semiconductor layer through an opening provided in the insulation film, and a second electrode layer formed on the first electrode layer such that it runs continuously from one end face of a resonator to the other in a direction of the waveguide. Widths of the portions of the second electrode layer near the end faces of the resonator are smaller than that of the other portion of the second electrode layer.

According to other aspect of the present invention, a ridge waveguide type semiconductor laser comprises an active layer, a semiconductor layer formed on the active layer and having a ridge-shaped waveguide therein, an insulation film formed on the semiconductor layer, a first electrode layer in contact with the semiconductor layer through an opening provided in the insulation film, an electrode lead-out line extending from the first electrode layer, a bonding pad provided on the insulation film such that it extends from the electrode lead-out line, and a second electrode layer formed on the bonding pad.

Other objects, features and advantages of the invention will appear more fully from the following description.

DETAILED DESCRIPTION OF THE PREFERRED EMBODIMENTS

Figure 8:
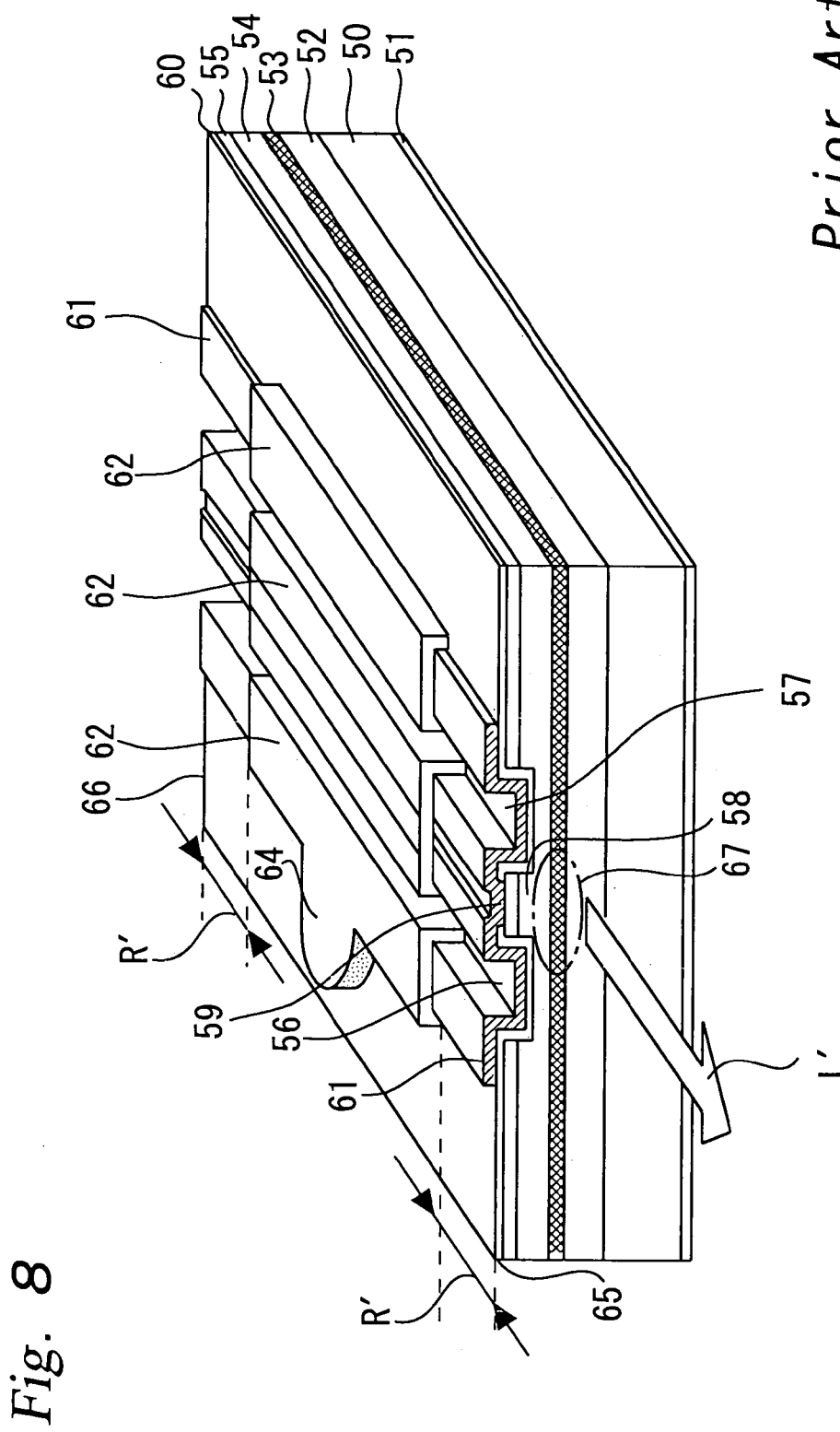
FIG. 8 is a perspective view of a conventional ridge waveguide type semiconductor laser.
Figure 9:
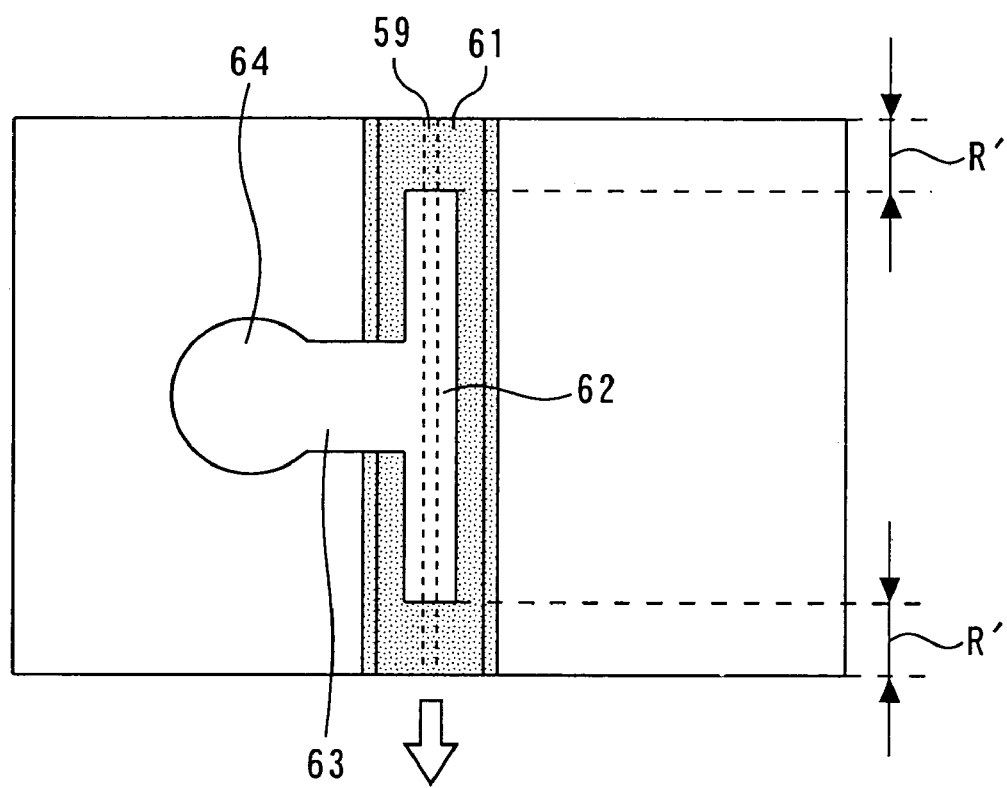
FIG. 9 is a plan view of the ridge waveguide type semiconductor laser in FIG. 8.

The present inventors have conducted a long-term life test on a semiconductor laser similar to the ridge waveguide type semiconductor laser shown in FIGS. 8 and 9 having a conventional structure, analyzing the deteriorated device, and found dark spots occurring within the active layer right under the neighborhoods of the edges of the Au-plated electrode. It should be noted that the long-term life test was carried out at a temperature of 85° C. with the output power set to 10 mW.

Such a fault is considered to be attributed to crystal defects in the active layer produced when a current flows predominantly in the portions (of the p side electrode) near the edges of the Au-plated electrode and thereby the temperatures of these portions are locally increased. Therefore, it is necessary to reduce the current concentration to the portions (of the p side electrode) near the edges of the Au-plated electrode in order to provide a highly reliable ridge waveguide type semiconductor laser capable of operating at high temperature and high speed.

The present inventors have simulated the relationship between the distance from the edges of the Au-plated electrode to the respective near end faces of the resonator and the degree of current concentration at the edges of the Au-plated electrode, and found that the current concentration at the edges of the Au-plated electrode decreases with increasing film thickness of the vapor deposition electrode or decreasing distance from the edges of the Au-plated electrode to the respective near end faces of the resonator.

Preferred embodiments of the present invention will be described in detail below with reference to the accompanying drawings.

First Embodiment

Figure 1:
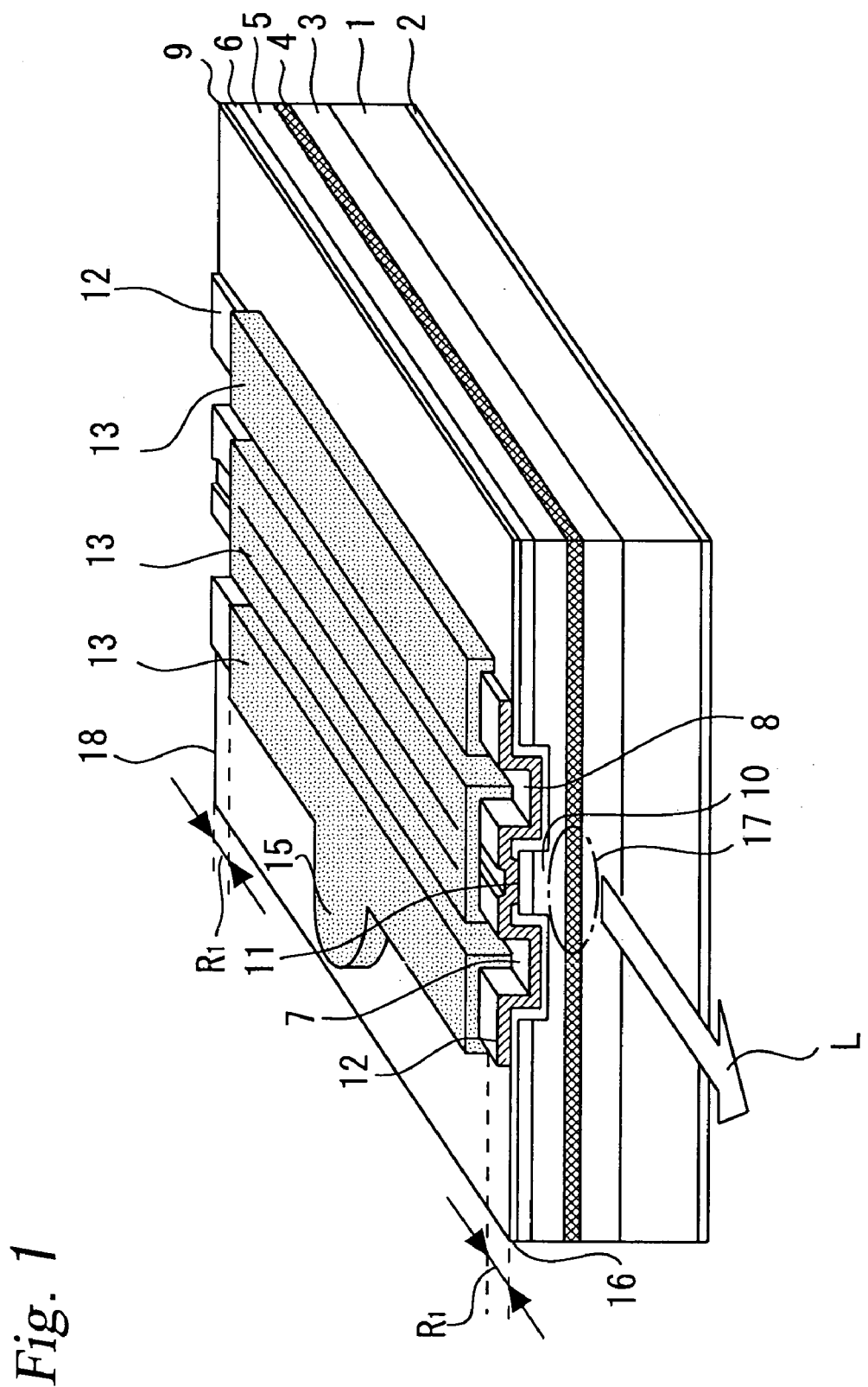
FIG. 1 is a perspective view of a ridge waveguide type semiconductor laser according to the first embodiment.
Figure 2:
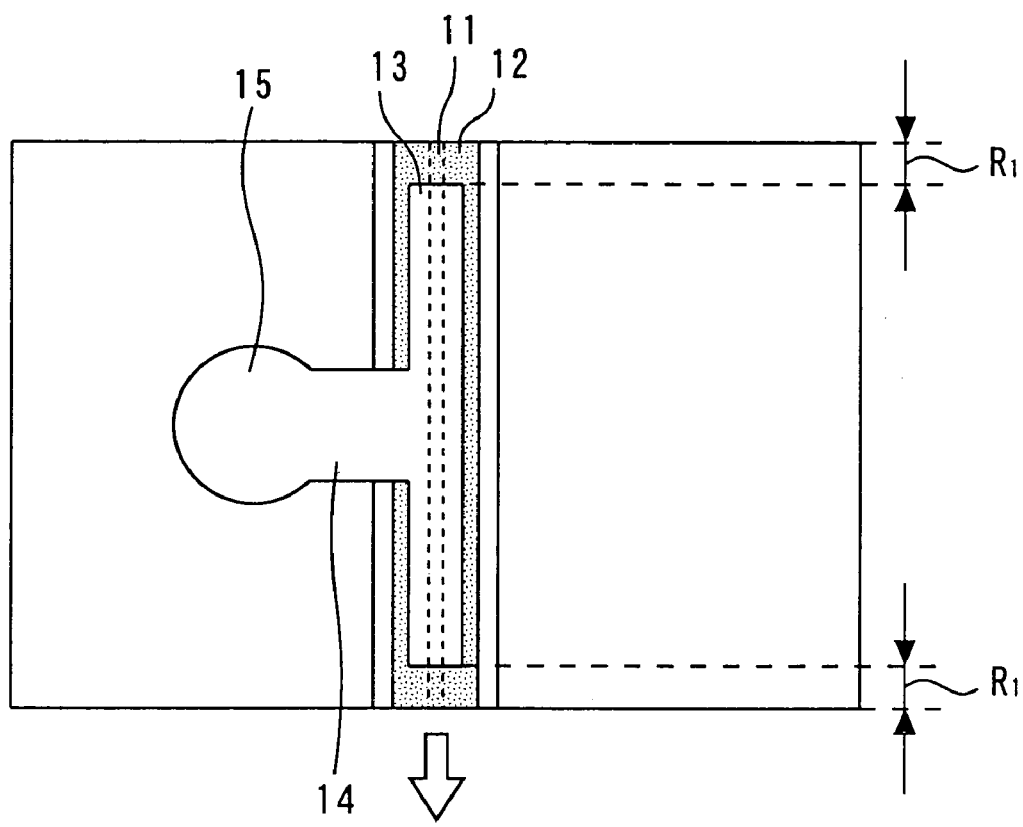
FIG. 2 is a plan view of the ridge waveguide type semiconductor laser in FIG. 1.

FIG. 1 is a perspective view of a ridge waveguide type semiconductor laser according to a first embodiment of the present invention, and FIG. 2 is a plan view of the ridge waveguide type semiconductor laser shown in FIG. 1. It should be noted that like numerals will be used to denote like components.

According to the present embodiment, the resonator length may beset to approximately 200 μm, which is shorter than the resonator length (approximately 300 μm) generally set for low-speed lasers. Further, the reflectance levels of the front and rear end faces of the resonator may be set to approximately 65% and 90%, respectively.

As shown in FIG. 1, an n side electrode 2 is provided on the rear surface of an n-InP substrate 1. On the other hand, an active layer and semiconductor layers formed on the active layer are provided above the top surface of the n-InP substrate 1, the semiconductor layers having a ridge-shaped waveguide formed therein.

Specifically, an epitaxial layer is formed on the top surface of the n-InP substrate 1. The epitaxial layer is made up of an n-InP cladding layer 3, an MQW (Multiple Quantum Well) active layer 4, a p-InP cladding layer 5, and a p-InGaAs contact layer 6 laminated in that order. The MQW active layer 4 includes AlGaInAs strained quantum wells. The epitaxial layer may be formed by the metal organic chemical vapor deposition method, etc.

Two grooves 7 and 8 are provided in the epitaxial layer such that they run in parallel with each other like stripes. These grooves may be formed by applying a predetermined etching technique to the epitaxial layer.

After forming the grooves 7 and 8 by etching, an $SiO_2$ (silicon dioxide) film 9 is formed on the entire top surface by the sputtering method, etc as an insulation film. The present embodiment is characterized in that the $SiO_2$ film 9 has a film thickness of 250 nm or less, reduced from the conventional film thickness 400 nm. It should be noted that instead of the $SiO_2$ film, another type of insulation film may be used in the present embodiment.

A ridge-shaped waveguide 10 is formed on the area sandwiched by the grooves 7 and 8. The $SiO_2$ film 9 has an opening 11 above the waveguide 10. Through the opening 11, the p-InGaAs contact layer 6 is in contact with a p side electrode 12 used as a first electrode layer.

The p side electrode 12 is formed as a result of depositing a Ti (titanium) vapor deposition electrode (not shown) and an Au (gold) vapor deposition electrode (not shown) on the p-InGaAs contact layer 6 in that order by the sputtering method, etc. The present embodiment is characterized in that the film thickness of the Au vapor deposition electrode is set to larger than a conventional value. Specifically, the film thickness of the Au vapor deposition electrode is preferably set to 200 nm or more, more preferably 700 nm or more. It should be noted that the film thickness of the Ti vapor deposition electrode may be set to a conventional value (for example, approximately 50 nm).

According to the present embodiment, the resistance of the p side electrode 12 can be reduced by increasing the film thickness of the Au vapor deposition electrode as described above. Furthermore, the film thickness of the $SiO_2$ film 9 may be reduced to 250 nm or less to obtain good cleaved surfaces. That is, if the thickness of the Au vapor deposition electrode is set to 700 nm or more and the film thickness of the $SiO_2$ film 9 is set to a conventional large value, the stress produced at the time of cleavage is absorbed by the Au vapor deposition electrode and the $SiO_2$ film 9, resulting in deterioration of the cleaved surface quality and hence reduction of the yield. According to the present embodiment, since the film thickness of the $SiO_2$ film 9 is reduced to as small as 250 nm or less, good cleaved surfaces can be formed even with the thickness of the Au vapor deposition electrode set to 700 nm or more.

It should be noted that according to the present embodiment, a barrier metal layer of Pt (platinum), etc. may be formed between the Ti vapor deposition electrode and the Au vapor deposition electrode. The film thickness of the barrier metal layer may be set to approximately 50 nm. This arrangement can prevent Au from sinking into the crystal, making it possible to provide a more highly reliable ridge waveguide type semiconductor laser.

Referring to FIGS. 1 and 2, an Au-plated electrode 13 is formed on the p side electrode 12 and the $SiO_2$ film 9 as a second electrode layer. An electrode lead-out line 14 provided on the $SiO_2$ film 9 is connected with the Au-plated electrode 13. The end of the electrode lead-out line 14 constitutes a bonding pad portion 15. Since the electrode lead-out line 14 including the bonding pad portion 15 is made of the same material as that of the Au-plated electrode 13, wires of Au, etc. can be reliably pressure-bonded to the bonding pad portion 15.

According to the present embodiment described above, the film thickness of the Au vapor deposition electrode is preferably set to 200 nm or more. In such a case, the film thickness of the Au-plated electrode 13 is preferably set to 800 nm or more.

As shown in FIGS. 1 and 2, the Au-plated electrode 13 is formed such that it is at a predetermined distance R1 from the end faces 16 and 18 of the laser resonator. The present embodiment is characterized in that the distance R1 is set to 20 μm or less, reduced from the conventional values 25 to 50 μm. This arrangement can reduce the current concentration to the portions of the p side electrode 12 near the edges of the Au-plated electrode 13, thereby reducing the current density.

Setting the distance R1 too small, however, makes it difficult to prevent the cleavage lines from crossing the Au-plated electrode 13 due to crystalline angular displacement within the substrate plane. If the cleavage lines cross the Au-plated electrode 13, the stress produced at the time of cleavage is absorbed by the Au-plated electrode 13, making it impossible to form good cleaved surfaces. Therefore, the distance R1 is preferably set to an appropriate value depending on the substrate size. For example, when a 2-inch substrate is used, the lower limit value for the distance R1 is practically approximately 10 μm.

The ridge waveguide type semiconductor laser of the present embodiment operates in the same manner as conventional semiconductor lasers of this type. Specifically, if a positive (+) bias and a negative (−) bias are applied to the p side electrode 12 and the n side electrode 2, respectively, a current flows through the waveguide 10 predominantly. As a result, electrons and holes are injected into an active region 17 right under the waveguide 10, leading to light emission due to electron-hole recombination. Then, if the current is increased to more than a threshold value, induced emission begins, which will lead to laser oscillation, emitting laser light L.

Figure 3:
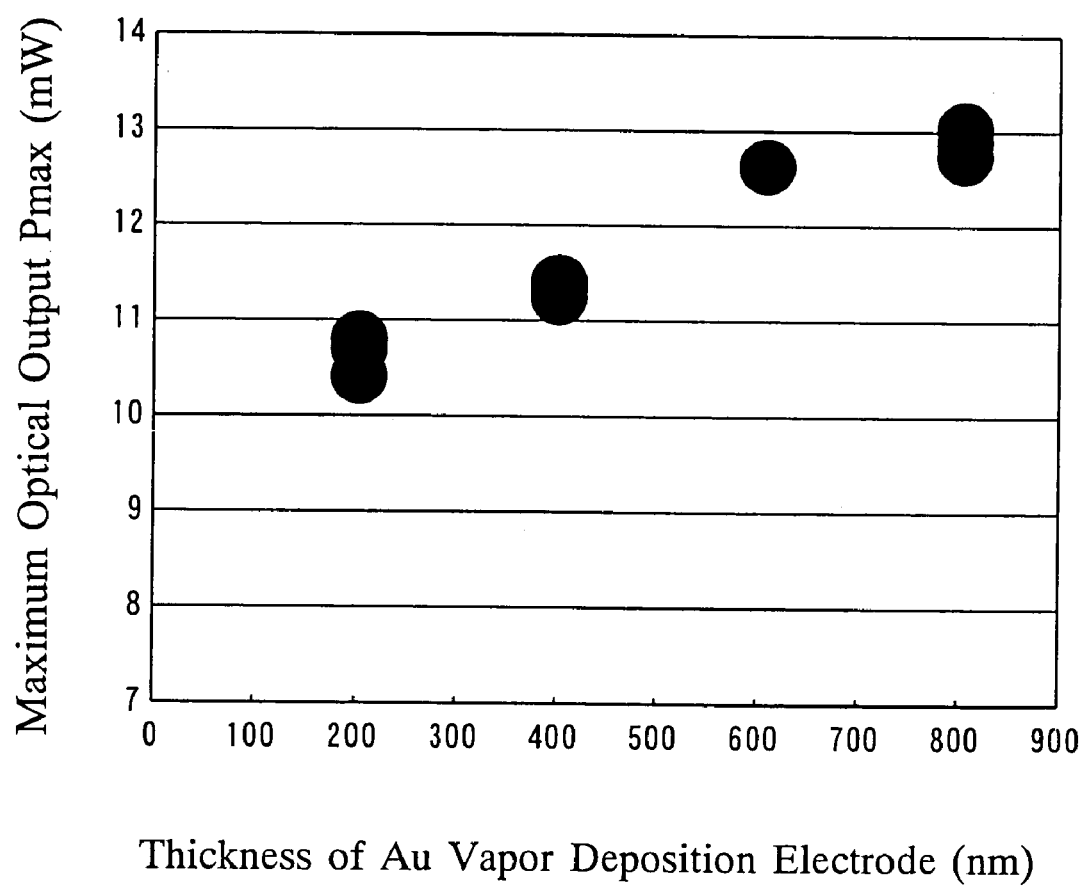
FIG. 3 shows a relationship between the thickness of the Au vapor deposition electrode and the maximum optical output $P_{max}$ according to the first embodiment.

FIG. 3 shows the relationship between the film thickness of the Au vapor deposition electrode of the present embodiment and the maximum optical output $P_{max}$. It should be noted that the maximum optical output $P_{max}$ was obtained at a temperature of 85° C.

As shown in FIG. 3, the larger the film thickness of the Au vapor deposition electrode, the larger the maximum optical output $P_{max}$. The value of $P_{max}$ saturates with the film thickness set to 700 nm or more. When the film thickness is set at 800 nm, $P_{max}$ is approximately 13 mW, which is larger than the value (10 to 11 mW) of $P_{max}$ obtained when the film thickness is set to 200 nm (conventional value). That is, there is an increased operational output margin with respect to the maximum optical output in the APC (Automatic Power Control) mode, which is a general method of driving a semiconductor laser. Therefore, the present embodiment can enhance the reliability of the device as well as extending its life.

Figure 4:
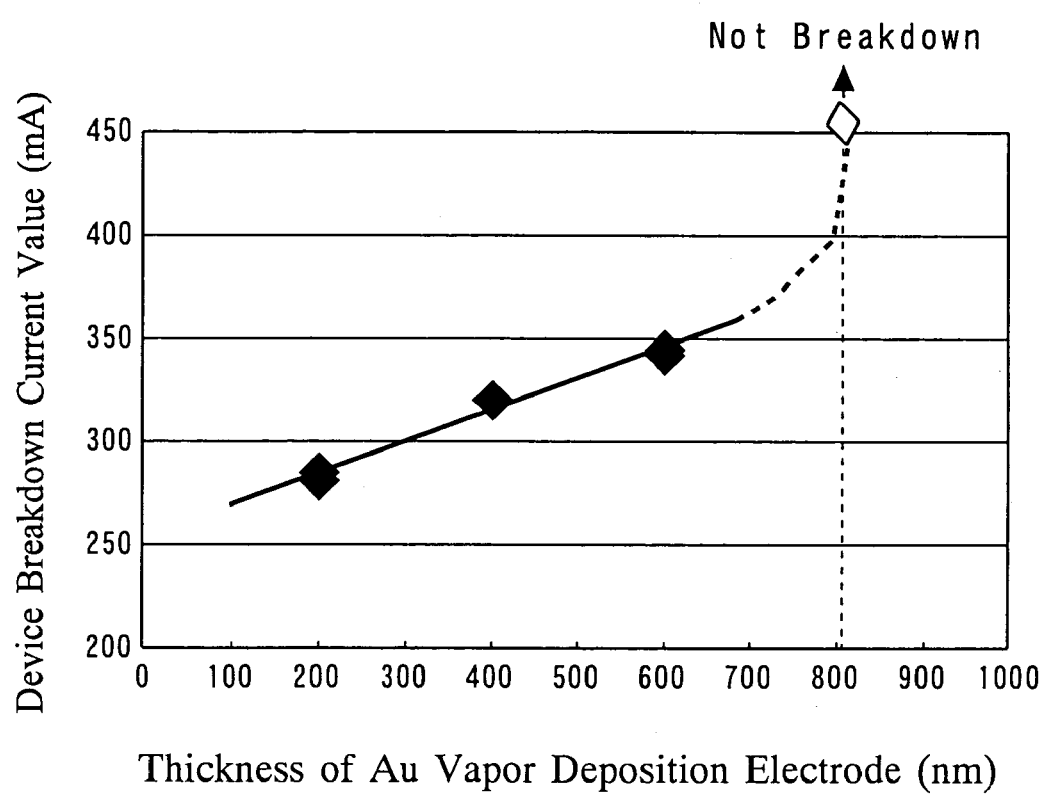
FIG. 4 shows a relationship between the thickness of the Au vapor deposition electrode and the device breakdown current value according to the first embodiment.

FIG. 4 shows the relationship between the film thickness of the Au vapor deposition electrode of the present embodiment and the device breakdown current value. A device breakdown current value is the (minimum) DC current value with which a semiconductor laser device can be completely destroyed.

As shown in FIG. 4, the larger the film thickness of the Au vapor deposition electrode, the larger the device breakdown current value. Specifically, when the film thickness of the Au vapor deposition electrode is set at 200 nm (which corresponds to a conventional structure), the device breakdown current value is approximately 280 mA. When, on the other hand, the film thickness of the Au vapor deposition electrode is set at 700 nm, the device breakdown current value is 350 mA or more. Furthermore, with the film thickness of the Au vapor deposition electrode set to 800 nm, a device breakdown current value of 450 mA or more is obtained. This means that a device having the structure of the present embodiment is less likely to break down than those having the conventional structure when an excessive current flows through the semiconductor laser due to noise or surge current. Therefore, the present embodiment can provide increased reliability and long life for ridge waveguide type semiconductor lasers even at a modulation rate of as high as 10 Gbps and a temperature of as high as 85° C.

Second Embodiment

Figure 5:
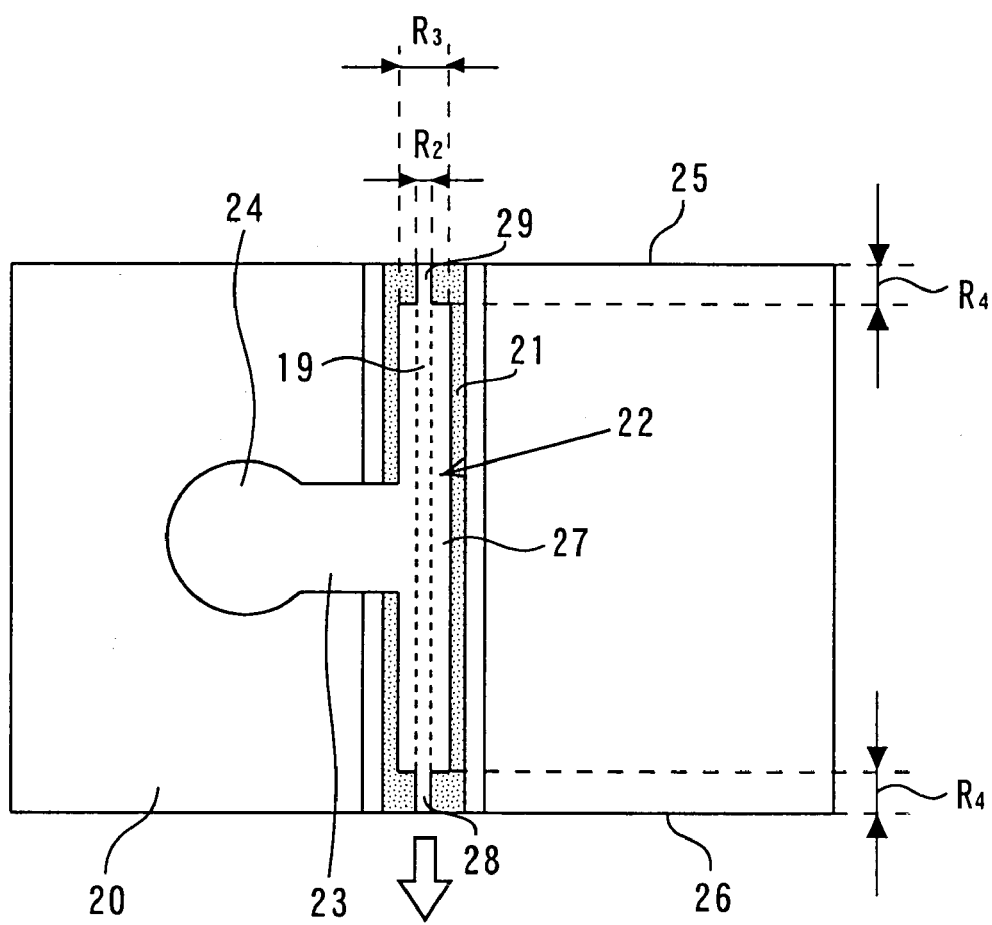
FIG. 5 is a plan view of a ridge waveguide type semiconductor laser according to the second embodiment.

FIG. 5 is a plan view of a ridge waveguide type semiconductor laser according to a second embodiment of the present invention. The present embodiment is characterized in that the Au-plated electrode is formed such that it runs continuously from one end face of the laser resonator to the other, and the width of the Au-plated electrode is narrowed at the portions near the end faces of the laser resonator.

It should be noted that according to the present embodiment, the resonator length may be set to approximately 200 µm, which is shorter than the resonator length (approximately 300 µm) generally set for low-speed lasers. Further, the reflectance levels of the front and rear end faces of the resonator may be set to approximately 65% and 90%, respectively.

The components of the ridge waveguide type semiconductor laser of the present embodiment are the same as those for the first embodiment. That is, an n side electrode is provided on the rear surface of an n-InP substrate. An active layer and semiconductor layers formed on the active layer are provided above the top surface of the n-InP substrate, the semiconductor layers having a ridge-shaped waveguide formed therein. Specifically, an epitaxial layer is provided on the top surface of the n-InP substrate. The epitaxial layer is made up of an n-InP cladding layer, an MQW active layer, a p-InP cladding layer, and a p-InGaAs contact layer formed in that order. The MQW active layer includes AlGaInAs strained quantum wells. Two grooves are provided in the epitaxial layer such that they run in parallel with each other like stripes. The ridge-shaped waveguide is formed on the area sandwiched by these grooves.

Furthermore, as shown in FIG. 5, an $SiO_2$ (silicon dioxide) film 20 (an insulation film) is formed on the entire top surface except for the opening (19) provided above the waveguide; that is, it is formed on the p-InGaAs contact layer and the grooves. The film thickness of the $SiO_2$ film 20 may be set to a conventional value (for example, approximately 400 nm). It should be noted that instead of the $SiO_2$ film, another type of insulation film may be used in the present embodiment.

A p side electrode 21 (a first electrode layer) is formed over the opening 19 provided in the $SiO_2$ film 20. The p side electrode 21 is in contact with the p-InGaAs contact layer (not shown) thereunder through the opening 19. The p side electrode 21 has a laminated structure in which a Ti (titanium) vapor deposition electrode (not shown) 50 nm thick and an Au (gold) vapor deposition electrode (not shown) 200 nm thick are formed in that order.

It should be noted that according to the present embodiment, a barrier metal layer of Pt (platinum), etc. may be formed between the Ti vapor deposition electrode and the Au vapor deposition electrode. The film thickness of the barrier metal layer may be set to approximately 50 nm. This arrangement can prevent Au from sinking into the crystal, making it possible to provide a more highly reliable ridge waveguide type semiconductor laser.

As shown in FIG. 5, an Au-plated electrode 22 is formed on the p side electrode 21 and the $SiO_2$ film 20 as a second electrode layer. An electrode lead-out line 23 is formed on the $SiO_2$ film 20 such that it extends from the Au-plated electrode 22. The end of the electrode lead-out line 23 constitutes a bonding pad portion 24. Since the electrode lead-out line 23 including the bonding pad portion 24 is made of the same material as that of the Au-plated electrode 22, wires of Au, etc. can be reliably pressure-bonded to the bonding pad portion 24.

According to the first embodiment, the Au-plated electrode is formed such that it is at a predetermined distance from the end faces of the laser resonator. The present embodiment, on the other hand, is characterized in that the Au-plated electrode 22 is formed such that it runs continuously from one end (face) (25) of the laser resonator to the other (26), and the width (the length perpendicular to the waveguide direction) of the Au-plated electrode 22 is narrowed at the portions near the end faces 25 and 26 of the laser resonator.

That is, as shown in FIG. 5, the Au-plated electrode has a planar shape made up of a rectangle 27 and (small) rectangles 28 and 29. The rectangles 28 and 29 are disposed on the respective sides of the rectangle 27, and their widths are smaller than that of the rectangle 27. Preferably, the width R2 of the rectangles 28 and 29 is set to approximately between 2 µm and 10 µm, and the width R3 of the rectangle 27 is set to approximately between 20 µm and 30 µm. Referring to FIG. 5, it should be noted that the electrode lead-out line 23 extends from the rectangle 27 in the width direction.

The length R4 of the rectangles 28 and 29 in the waveguide direction is preferably set to an appropriate value, considering the tradeoff between variations in the cleavage angle and the heat dissipation. Specifically, the length R4 may be preferably set to approximately between 10 µm and 20 µm.

According to the present embodiment described above, the Au-plated electrode 22 is formed such that it meets the end faces 25 and 26 of the laser resonator. Therefore, to reduce the absorption by the Au-plated electrode 22 of the stress occurring at the time of cleavage, the film thickness of the Au-plated electrode 22 is preferably set to smaller than a conventional value. Specifically, the film thickness of the Au-plated electrode 22 is preferably set to approximately 1 µm. Furthermore, as described above, the film thickness of the Au vapor deposition electrode constituting the p side electrode 21 may be set smaller than in the first embodiment (for example, approximately 200 nm) to obtain good cleaved surfaces also in the present embodiment.

The ridge waveguide type semiconductor laser of the present embodiment operates in the same manner as conventional semiconductor lasers of this type. Specifically, if a positive (+) bias and a negative (−) bias are applied to the p side electrode 21 and the n side electrode, respectively, a current flows through the waveguide predominantly. As a result, electrons and holes are injected into the active region right under the waveguide, leading to light emission due to electron-hole recombination. Then, if the current is increased to more than a threshold value, induced emission begins, which will lead to laser oscillation.

According to the present embodiment, the Au-plated electrode is formed such that it meets the end faces of the laser resonator, making it possible to efficiently dissipate the heat generated from the active layer. Further, the width of the Au-plated electrode is narrowed at the portions near the end faces of the laser resonator, making it possible to reduce the absorption by the Au-plated electrode of the stress produced at the time of cleavage. As a result, good cleaved surfaces can be obtained. It should be noted that the Au-plated electrode excluding the portions near the end faces of the laser resonator is formed such that its width is large, dissipation of the heat produced from the active layer is not prevented.

Further according to the present embodiment, since the Au-plated electrode is formed such that it runs from one end of the laser resonator to the other, the edges of the Au-plated electrode are not located on the waveguide, making it possible to eliminate the problem of current concentration at the edges of the Au-plated electrode.

Third Embodiment

Figure 6:
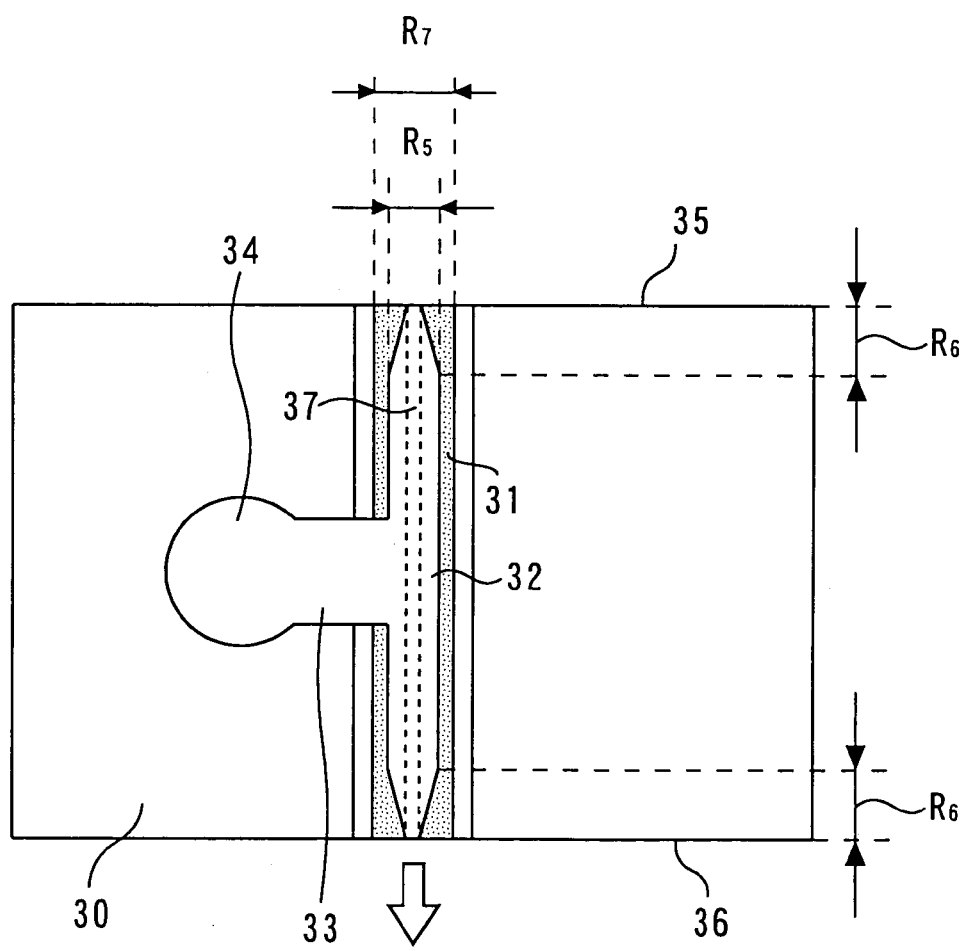
FIG. 6 is a plan view of a ridge waveguide type semiconductor laser according to the third embodiment.

FIG. 6 is a plan view of a ridge waveguide type semiconductor laser according to a third embodiment of the present invention. The present embodiment is characterized in that the Au-plated electrode is formed such that it runs continuously from one end of the laser resonator to the other, and the width of the electrode is gradually narrowed at the portions near the end faces of the laser resonator.

It should be noted that according to the present embodiment, the resonator length may be set to approximately 200 μm, which is shorter than the resonator length (approximately 300 μm) generally set for low-speed lasers. Further, the reflectance levels of the front and rear end faces of the resonator may be set to approximately 65% and 90%, respectively.

The components of the ridge waveguide type semiconductor laser of the present embodiment are the same as those for the first embodiment. That is, an n side electrode is provided on the rear surface of an n-InP substrate. An active layer and semiconductor layers formed on the active layer are provided above the top surface of the n-InP substrate, the semiconductor layers having a ridge-shaped waveguide formed therein.

Specifically, an epitaxial layer is provided on the top surface of the n-InP substrate. The epitaxial layer is made up of an n-InP cladding layer, an MQW active layer, a p-InP cladding layer, and a p-InGaAs contact layer formed in that order. The MQW active layer includes AlGaInAs strained quantum wells. Two grooves are provided in the epitaxial layer such that they run in parallel with each other like strips. The ridge-shaped waveguide is formed on the area sandwiched by these grooves.

As shown in FIG. 6, an $SiO_2$ (silicon dioxide) film 30 (an insulation film) is formed on the entire top surface except for the opening (37) provided above the waveguide; that is, it is formed on the p-InGaAs contact layer and the grooves. The film thickness of the $SiO_2$ film 30 may be set to a conventional value (for example, approximately 400 nm). It should be noted that instead of the $SiO_2$ film, another type of insulation film maybe used in the present embodiment.

A p side electrode 31 (a first electrode layer) is formed over the opening 37 in the $SiO_2$ film 30. The p side electrode 31 is in contact with the p-InGaAs contact layer (not shown) thereunder through the opening 37. The p side electrode 31 has a laminated structure in which a Ti (titanium) vapor deposition electrode (not shown) 50 nm thick and an Au (gold) vapor deposition electrode (not shown) 200 nm thick are formed in that order.

It should be noted that according to the present embodiment, a barrier metal layer of Pt (platinum), etc. may be formed between the Ti vapor deposition electrode and the Au vapor deposition electrode. The film thickness of the barrier metal layer may be set to approximately 50 nm. This arrangement can prevent Au from sinking into the crystal, making it possible to provide a more highly reliable ridge waveguide type semiconductor laser.

As shown in FIG. 6, an Au-plated electrode 32 is formed on the p side electrode 31 and the $SiO_2$ film 30 as a second electrode layer. An electrode lead-out line 33 is formed on the $SiO_2$ film 30 such that it extends from the Au-plated electrode 32. The end of the electrode lead-out line 33 constitutes a bonding pad portion 34. Since the electrode lead-out line 33 including the bonding pad portion 34 is made of the same material as that of the Au-plated electrode 32, wires of Au, etc. can be reliably pressure-bonded to the bonding pad portion 34.

According to the first embodiment, the Au-plated electrode is formed such that it is at a predetermined distance from the end faces of the laser resonator. The present embodiment, on the other hand, is characterized in that the Au-plated electrode 32 is formed such that it runs continuously from one end (face) (35) of the laser resonator to the other (36). Furthermore, as shown in FIG. 6, the planar shape of the Au-plated electrode 32 is such that its width R5 (the length perpendicular to the waveguide direction) is gradually narrowed at the portions near the end faces 35 and 36 of the laser resonator. Specifically, at these portions, the width R5 of the Au-plated electrode 32 is gradually reduced as it approaches the end faces 35 and 36 of the laser resonator, forming tapered shapes. The width R5 of these tapered portions of the Au-plated electrode 32 is preferably set to vary in the range of 2 μm–10 μm. The length R6 of portions of the Au-plated electrode 32 in the waveguide direction, on the other hand, is preferably set to between 20 μm and 50 μm.

Thus, according to the present embodiment, the Au-plated electrode 32 is formed such that it meets the end faces of the laser resonator. Therefore, to reduce the absorption by the Au-plated electrode 32 of the stress occurring at the time of cleavage, the film thickness of the Au-plated electrode 32 is preferably set to smaller than a conventional value. Specifically, the film thickness of the Au-plated electrode 32 is preferably set to approximately 1 μm. Furthermore, as described above, the film thickness of the Au vapor deposition electrode constituting the p side electrode 31 may be set smaller than in the first embodiment (for example, approximately 200 nm) to obtain good cleaved surfaces also in the present embodiment.

The ridge waveguide type semiconductor laser of the present embodiment operates in the same manner as conventional semiconductor lasers of this type. Specifically, if a positive (+) bias and a negative (−) bias are applied to the p side electrode and the n side electrode, respectively, a current flows through the waveguide predominantly. As a result, electrons and holes are injected into the active region right under the waveguide, leading to light emission due to electron-hole recombination. Then, if the current is increased to more than a threshold value, induced emission begins, which will lead to laser oscillation.

According to the present embodiment, the Au-plated electrode 32 is formed such that meets the end faces 35 and 36 of the laser resonator, making it possible to efficiently dissipate the heat generated from the active layer.

Further according to the present embodiment, the Au-plated electrode 32 is formed such that the width R5 of the Au-plated electrode 32 is gradually reduced as it approaches the end faces 35 and 36 of the laser resonator, making it possible to reduce the absorption by the Au-plated electrode 32 of the stress produced at the time of cleavage. As a result, good cleaved surfaces can be obtained. It should be noted that the Au-plated electrode 32 excluding the portions near the end faces of the laser resonator is formed such that it is rectangular and its width R7 is constant. Since R7>R5, dissipation of the heat produced from the active layer is not prevented even though the width of the Au-plated electrode 32 is gradually reduced at the portions near the end faces 35 and 36 of the laser resonator. It should be noted that the electrode lead-out line 33 extends from the rectangular portion in the width direction.

Further according to the present embodiment, since the Au-plated electrode 32 is formed such that it runs continuously from one end (face) (35) of the laser resonator to the other (36), the edges of the Au-plated electrode 32 are not located on the waveguide, making it possible to eliminate the, problem of current concentration at the edges of the Au-plated electrode 32.

Fourth Embodiment

Figure 7:
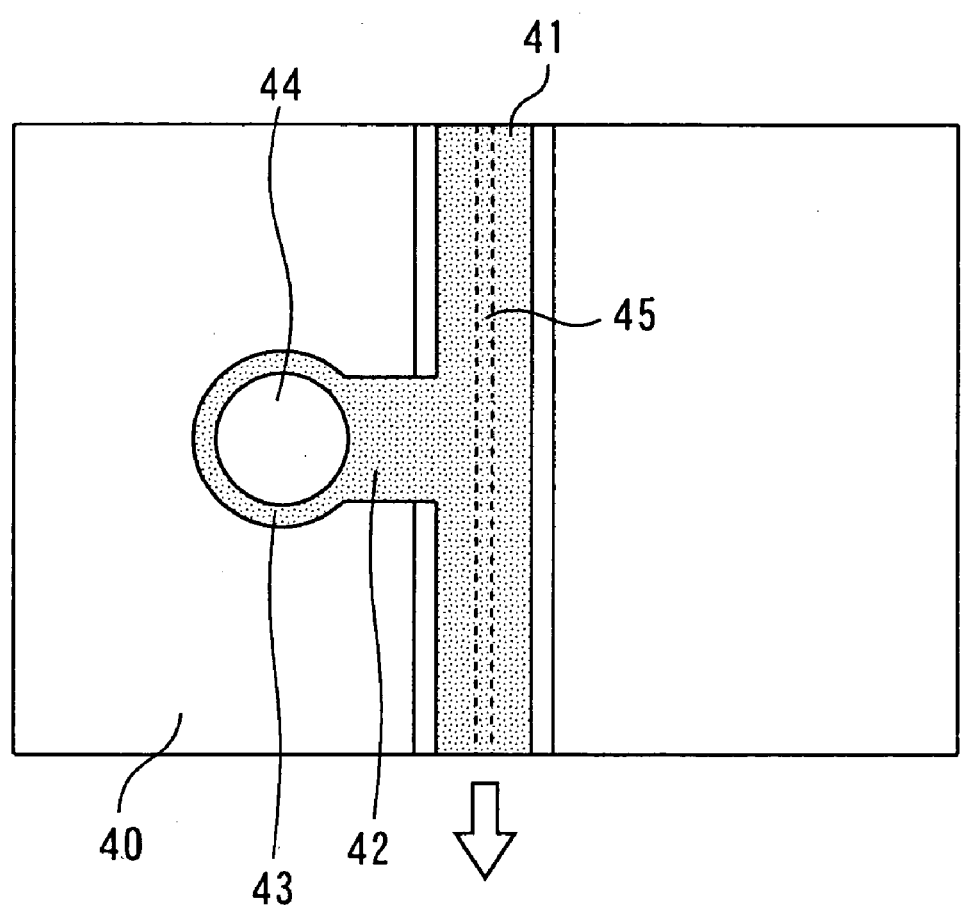
FIG. 7 is a plan view of a ridge waveguide type semiconductor laser according to the fourth embodiment.

FIG. 7 is a plan view of a ridge waveguide type semiconductor laser according to a fourth embodiment of the present invention. The present embodiment is characterized in that the electrode lead-out line having the bonding pad portion is formed such that the electrode lead-out line extends from the p side electrode, and the Au-plated electrode is formed on the bonding pad portion.

It should be noted that according to the present embodiment, the resonator length may be set to approximately 200 µm, which is shorter than the resonator length (approximately 300 µm) generally set for low-speed lasers. Further, the reflectance levels of the front and rear end faces of the resonator may be set to approximately 65% and 90%, respectively.

The configuration of the ridge waveguide type semiconductor laser of the present embodiment is the same as that for the first embodiment except that the Au-plated electrode is formed on the bonding pad portion, instead of the p side electrode. That is, an n side electrode is provided on the rear surface of an n-InP substrate. An active layer and semiconductor layers formed on the active layer are provided above the top surface of the n-InP substrate, the semiconductor layers having a ridge-shaped waveguide formed therein.

Specifically, an epitaxial layer is formed on the top surface of the n-InP substrate. The epitaxial layer is made up of an n-InP cladding layer, an MQW active layer, a p-InP cladding layer, and a p-InGaAs contact layer laminated in that order. The MQW active layer includes AlGaInAs strained quantum wells. Two grooves are provided in the epitaxial layer such that they run in parallel with each other like stripes. The ridge-shaped waveguide is formed on the area sandwiched by these grooves.

As shown in FIG. 7, an $SiO_2$ (silicon dioxide) film 40 (an insulation film) is formed on the entire top surface except for the opening (45) provided above the waveguide; that is, it is formed on the p-InGaAs contact layer and the grooves. The film thickness of the $SiO_2$ film 40 may be set to a conventional value (for example, approximately 400 nm). It should be noted that instead of the $SiO_2$ film, another type of insulation film may be used in the present embodiment.

A p side electrode 41 (a first electrode layer) is formed over the opening 45 in the $SiO_2$ film 40. The p side electrode 41 is in contact with the p-InGaAs contact layer (not shown) thereunder through the opening 45. The p side electrode 41 has a laminated structure in which a Ti (titanium) vapor deposition electrode (not shown) and an Au (gold) vapor deposition electrode (not shown) are formed in that order. The present embodiment is characterized in that the film thickness of the Au vapor deposition electrode is set to larger than a conventional value. Specifically, it is preferably set to 700 nm or more. It should be noted that the film thickness of the Ti vapor deposition electrode may be set to a conventional value (for example, approximately 50 nm).

It should be noted that according to the present embodiment, a barrier metal layer of Pt (platinum), etc. may be formed between the Ti vapor deposition electrode and the Au vapor deposition electrode. The film thickness of the barrier metal layer may be set to approximately 50 nm. This arrangement can prevent Au from sinking into the crystal, making it possible to provide a more highly reliable waveguide type semiconductor laser.

Further, the ridge waveguide type semiconductor laser of the present embodiment includes an electrode lead-out line 42 formed on the $SiO_2$ film 40 such that it extends from the p side electrode 41. The end of the electrode lead-out line 42 constitutes a bonding pad portion 43. An Au-plated electrode 44 is formed on the bonding pad portion 43 as a second electrode layer.

The ridge waveguide type semiconductor laser of the present embodiment operates in the same manner as conventional semiconductor lasers of this type. Specifically, if a positive (+) bias and a negative (−) bias are applied to the p side electrode and the n side electrode, respectively, a current flows through the waveguide predominantly. As a result, electrons and holes are injected into the active region right under the waveguide, leading to light emission due to electron-hole recombination. Then, if the current is increased to more than a threshold value, induced emission begins, which will lead to laser oscillation.

In the structure of the present embodiment, the Au-plated electrode 44 is not formed on the waveguide, which eliminates the problem of current concentration to the portions of the p side electrode near the edges of the Au-plated electrode, making it possible to provide a highly reliable ridge waveguide type semiconductor laser. Furthermore, the Au-plated electrode 44 is formed on the bonding pad portion 43, instead, so that wires of Au, etc. can be reliably pressure-bonded to it.

Further according to the present embodiment, since the Au layer is formed to have a large thickness, the heat produced from the active layer can be effectively dissipated even if the Au-plated electrode is not provided on the waveguide.

The above first to fourth embodiments were described as applied to ridge waveguide type semiconductor lasers having an active layer formed of AlGaAsP. However, the present invention is not limited to this particular type of semiconductor laser. For example, the present invention can be applied to semiconductor lasers such as: 1.3 µm-band long-wavelength semiconductor lasers having an active layer formed of InGaAsP or GaInNaAs quantum wells; 650 nm-band red semiconductor lasers for optical disks having an active layer formed of AlGaInP quantum wells; 780 nm-band short-wavelength semiconductor lasers for optical disks having an active layer formed of AlGaAs quantum wells; and blue-violet semiconductor lasers having an active layer formed of InGaN quantum wells.

Further, according to the above first to fourth embodiments, the first electrode layer has a structure made up of a Ti vapor deposition electrode and an Au vapor deposition electrode. However, the present invention is not limited to this particular structure. The first electrode layer may be made up of other metals.

Still further, even though the above first to fourth embodiments employ an Au-plated electrode as the second electrode layer, the present invention is not limited to this particular arrangement. The second electrode may be an electrode layer plated with another metal.

The features and advantages of the present invention may be summarized as follows.

According to one aspect, the distance from the end faces of the resonator to the respective near edges of the second electrode layer may be set to 20 μm or less to reduce current concentration to the portions of the first electrode layer near the edges of the second electrode layer, making it possible to reduce the current density.

Further according to another aspect, the second electrode layer may be formed such that it runs continuously from one end of the resonator to the other, making it possible to efficiently dissipate the heat generated from the active layer. Furthermore, the widths of the portions of the second electrode layer, near the end faces (of the resonator) may be set smaller than that of the other portion of the second electrode layer to reduce the absorption by the second electrode layer of the stress produced at the time of cleavage, making it possible to obtain good cleaved surfaces.

Still further according to other aspect, the second electrode layer may not be provided on the waveguide to eliminate the problem of current concentration in the first electrode layer, making it possible to provide a highly reliable ridge waveguide type semiconductor laser.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-125275, filed on Apr. 30, 2003 including specification, claims, drawings and summary, on which the Convention priority of the present application is based, are incorporated herein by reference in its entirely.

What is claimed is:

1. A ridge waveguide semiconductor laser including an optical resonator and comprising:
    an active layer;
    a semiconductor layer on said active layer and having a ridge-shaped waveguide therein;
    an insulating film on said semiconductor layer and having a thickness not exceeding 250 nm;
    a first electrode layer in contact with said semiconductor layer through an opening in said insulating film, said first electrode layer including a titanium electrode layer, a barrier layer, and a gold electrode layer, laminated in that order; and
    a second electrode layer, on said first electrode layer, having a stripe shape, and extending generally parallel to said waveguide, wherein distance from an end face of the resonator to an edge of said second electrode layer is less than 20 μm.

2. The ridge waveguide semiconductor laser according to claim 1, further comprising:
    an electrode lead-out line extending from said second electrode layer; and
    a bonding pad on said insulating film extending from said electrode lead-out line.

3. A ridge waveguide semiconductor laser including an optical resonator and comprising:
    an active layer;
    a semiconductor layer on said active layer and having a ridge-shaped waveguide therein;
    an insulating film on said semiconductor layer;
    a first electrode layer in contact with said semiconductor layer through an opening in said insulating film, said first electrode layer including a titanium electrode layer and a gold electrode layer, laminated in that order, and said gold electrode layer having a thickness of at least 700 nm; and
    a second electrode layer, on said first electrode layer, having a stripe shape, and extending generally parallel to said waveguide, wherein distance from an end face of the resonator to an edge of said second electrode layer is less than 20 μm.

4. The ridge waveguide semiconductor laser according to claim 3 wherein the second electrode layer is a gold-plated layer having a thickness of at least 800 nm.

5. A ridge waveguide semiconductor laser including an optical resonator and comprising:
    an active layer;
    a semiconductor layer on said active layer and having a ridge-shaped waveguide therein;
    an insulating film on said semiconductor layer;
    a first electrode layer in contact with said semiconductor layer through an opening in said insulating film, said first electrode layer including a titanium electrode layer and a gold electrode layer, laminated in that order, said gold electrode layer having a thickness of at least 200 nm; and
    a second electrode layer on said first electrode layer, having a stripe shape and extending generally parallel to said waveguide, said second electrode layer being a gold-plated layer having a thickness of at least 800 nm, wherein distance from an end face of the resonator to an edge of said second electrode layer is less than 20 μm.

6. The ridge waveguide semiconductor laser according to claim 5, further comprising a barrier metal layer between said titanium electrode layer and said gold electrode layer.

7. The ridge waveguide semiconductor laser according to claim 6, wherein said barrier metal layer is a platinum layer.

* * * * *